United States Patent
Cho (10) Patent No.: US 9,903,620 B2
(45) Date of Patent: Feb. 27, 2018

(54) HEAT CONVERSION DEVICE

(71) Applicant: LG INNOTEK CO., LTD., Seoul (KR)

(72) Inventor: Yong Sang Cho, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 219 days.

(21) Appl. No.: 14/622,129

(22) Filed: Feb. 13, 2015

(65) Prior Publication Data

US 2015/0233613 A1    Aug. 20, 2015

(30) Foreign Application Priority Data

Feb. 14, 2014 (KR) .................. 10-2014-0017321

(51) Int. Cl.
*F25B 21/02* (2006.01)
*F25B 21/04* (2006.01)

(52) U.S. Cl.
CPC .................. *F25B 21/04* (2013.01)

(58) Field of Classification Search
CPC ......... F25B 21/02; F24F 5/0042; H01L 35/30
USPC ..................... 62/3.2, 3.3, 3.4, 3.7
See application file for complete search history.

(56) References Cited

U.S. PATENT DOCUMENTS

2007/0144573 A1* 6/2007 Mihara .................. C03C 17/23
                                                        136/205

FOREIGN PATENT DOCUMENTS

| JP | 05248653 A | 9/1993 |
| JP | 06080016 A | 3/1994 |
| JP | 2001259345 A | 9/2001 |
| JP | 2008232565 A | 10/2008 |

OTHER PUBLICATIONS

Extended European Search Report dated Jul. 27, 2015 in European Application No. 15154960.7.

* cited by examiner

*Primary Examiner* — Melvin Jones
(74) *Attorney, Agent, or Firm* — Saliwanchik, Lloyd & Eisenschenk

(57) ABSTRACT

Provided is a heat conversion device including a thermoelectric element, the heat conversion device capable of implementing a heat conversion function of high efficiency in spite of low power consumption by disposing a heat absorption module and a heat emission module in a horizontal direction in a structure of a heat exchange device to which a thermoelectric module is applied, and by implementing a heat conversion effect for air while maintaining a desired air volume and air velocity without flow path resistance.

17 Claims, 7 Drawing Sheets

HEAT CONVERSION DEVICE

CROSS-REFERENCE TO RELATED APPLICATION

This application claims the benefit under 35 U.S.C. § 119 Korean Patent Application No. 10-2014-0017321, filed Feb. 14, 2014, which is hereby incorporated by reference in its entirety.

BACKGROUND

Field of the Invention

Embodiments of the present invention relate to a heat conversion device including a thermoelectric element.

Description of the Related Arts

In general, a thermoelectric element including a thermoelectric device has a structure in which a PN junction pair is formed by bonding a p-type thermoelectric material and an n-type thermoelectric material between metal electrodes. When a temperature difference is provided between the materials of this PN junction pair, electric power is generated by the Seebeck effect so that a thermoelectric element can serve as a power generating device. Also, the thermoelectric element may be used as a temperature controlling device by the Peltier effect in which one material of the PN junction pair is cooled and the other material is heated.

In such a case, the thermoelectric element may be applied as a device that performs both dehumidification and drying of entering air by forming a radiant heat member on a heat emission part and a heat absorption part. However, in this case, even though the air entered from the thermoelectric into the heat absorption part is primarily dehumidified, and the air is then introduced to the heat emission part arranged at an upper portion of the thermoelectric element so as to be dried, it is problematic in that dehumidification efficiency is reduced because the flow of air is increased and flow path resistance is generated. In order to settle this problem, there is a way to entirely make the flow of air strong by increasing the strength of entering air, but this way leads to an increase of power consumption and an increase in noise. Thus, it is problematic in that performance as a dehumidifier is very reduced.

BRIEF SUMMARY

The present invention has been made keeping in mind the above problems, an aspect of embodiments of the present invention provides a heat conversion device capable of implementing a heat conversion function of high efficiency in spite of low power consumption by disposing a heat absorption module and a heat emission module in a horizontal direction in a structure of a heat exchange device to which a thermoelectric module is applied, and by implementing a heat conversion effect for air while maintaining a desired air volume and air velocity without flow path resistance.

According to an aspect of an embodiment of the present invention, a heat conversion device may include: a first module including a first heat conversion member; a second module including a second heat conversion member that introduces air passing through the first module to perform heat conversion; and a thermoelectric module that comes into contact with the first module and the second module to control a heat conversion function, wherein the first module and the second module are arranged in one side direction based on the thermoelectric module. That is, the first module and the second module are disposed in a horizontal direction rather than being disposed up and down based on the thermoelectric module so that the flow path resistance of entering air can be reduced and heat conversion efficiency can be maximized.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Hereinafter, the configurations and operations according to embodiments of the present invention will be described in detail with reference to the accompanying drawings. The present invention may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms are only used for the purpose for distinguishing a constitutive element from other constitutive element. Furthermore, the elements having the similar functions and operations of the drawings are given the same reference numerals. As used herein, the singular forms are intended to include the plural forms as well, unless the context clearly indicates otherwise.

Figure 1:
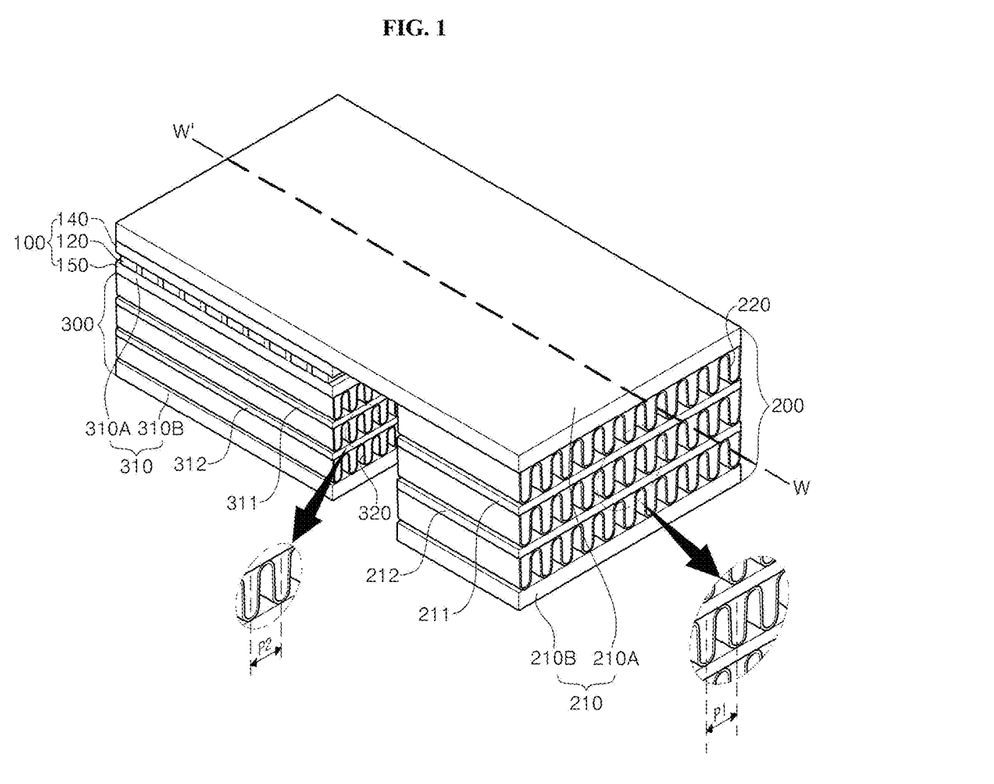
FIG. 1 illustrates a perspective concept view of a heat conversion device according to an embodiment of the present invention.
Figure 2:
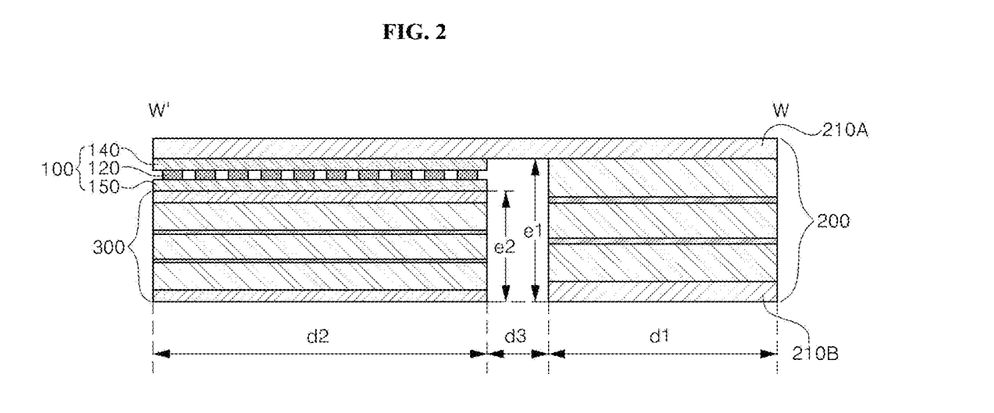
FIG. 2 illustrates a side concept view of FIG. 1.

FIG. 1 illustrates a perspective concept view of a heat conversion device according to an embodiment of the present invention, and FIG. 2 illustrates a side concept view taken along lines W-W' of FIG. 1.

Referring to FIGS. 1 and 2, the heat conversion device according to the present embodiment of the invention includes: a first module 200 including a first heat conversion member 220; a second module 300 including a second heat conversion member 320 that makes flow in air passing through the first module to perform heat conversion; and a thermoelectric module 100 that comes into contact with the first module and the second module to control a heat conversion function. In particular, the heat conversion device according to the present embodiment of the invention may be configured such that the first module and the second module are disposed in 'one side direction' based on the thermoelectric module.

In such a case, 'the one side direction' means any one direction of an upper direction or a lower direction based on the thermoelectric module. For example, as one embodiment of the present invention, the second module 300 may be disposed at a lower portion of the thermoelectric module 100, and the first module 200 may be disposed so that a flow path of air can be formed in a horizontal direction of the second module 300. It is advantageous in that this structure may minimize flow path resistance and may increase thermoelectric efficiency by enabling the flow path of air in the same space to continuously go through the module performing a heat absorbing function and a heat emitting function.

The thermoelectric module 100, which will be described later (see FIG. 7), has a structure in which a thermoelectric semiconductor element 120 electrically connected to a pair of substrates 140, 150 facing each other is disposed. The thermoelectric semiconductor element is configured such that a P-type semiconductor and an N-type semiconductor are disposed to make a pair, and a heat absorption part and a heat emission part are provided at the pair of substrates by the Peltier effect upon applying of electric currents. In the present embodiment of the invention, in the structure of FIG. 1, a heat absorption region is formed toward the first substrate 140, and a heat emission region is formed toward the second substrate 150.

The first module 200 has a first conversion member receiving unit 210 including a third substrate 210A in contact with the first substrate 140 that forms the heat absorption region of the thermoelectric module 100. In the structure illustrated in FIGS. 1 and 2, the first conversion member receiving unit 210 includes a separate lower substrate 210B on an opposite surface to the third substrate 210A, but the present invention is not limited to such a configuration. The first conversion member receiving unit 210 may be implemented such that the remaining parts except for the flow path of air are sealed.

Also, the first conversion member receiving unit 210 may be implemented in a structure in which at least one first heat conversion member 222 is included in the inside of the first conversion member receiving unit. In the structure illustrated in FIG. 1, the third substrate 210A of the first module 200 comes into contact with the first substrate 140 in which a heat absorption reaction is generated, thereby performing a heat absorption function from the first module 200, namely, a function of reducing a temperature. Accordingly, when external air introduced from an external fan and the like is introduced into the first module 200, the introduced air comes into contact with the first module and the first heat conversion member 220 of the inside via the first substrate 140 of the thermoelectric module, thereby causing a reduction in a temperature of air. Thus, the moisture in humid air may be condensed.

To do so, the first module 200 is introduced to cause a reduction in temperature due to the heat absorption reaction from the first substrate 140 so that a low temperature of the first substrate can be transmitted to the first heat conversion member of the first module 200 and the first heat conversion member receiving unit via the third substrate, thereby enabling maintenance of the low temperature. In particular, in the present embodiment of the invention, the first heat transfer member 220 may be implemented to form specific flow path patterns so that a contact area with air can be maximized (see FIG. 4). In the structure illustrated in FIG. 1, it is exemplified that the third substrate 210A and the first substrate 140 are formed as separate individual structures, but in order to further simplify the structure and perform effective heat transfer, the first substrate 140 and the third substrate 210A may be integrally implemented.

The second module 300 enables the inflow of air after moisture in cooled air passing through the inside of the first module 200 has been condensed and discharged. The second module may include a second heat transfer member receiving unit 310 in contact with the second substrate 140. The second substrate 150 comes into surface contact with a member such as a fourth substrate 310A and the like, so that heat resulting from a heating reaction of the second module is transmitted to the inside of the second heat transfer member receiving unit 310 and the second heat transfer member, thereby enabling performing of a function of receiving the air passing through the first module 200 and converting the air into dried air using the transmitted heat. Moreover, the fourth substrate 310A and the second substrate 150 may be formed as separate structures, but in order to further simplify the structure and implement efficiency heat transfer, the fourth substrate and the second substrate may be implemented in an integral structure.

Figure 3:
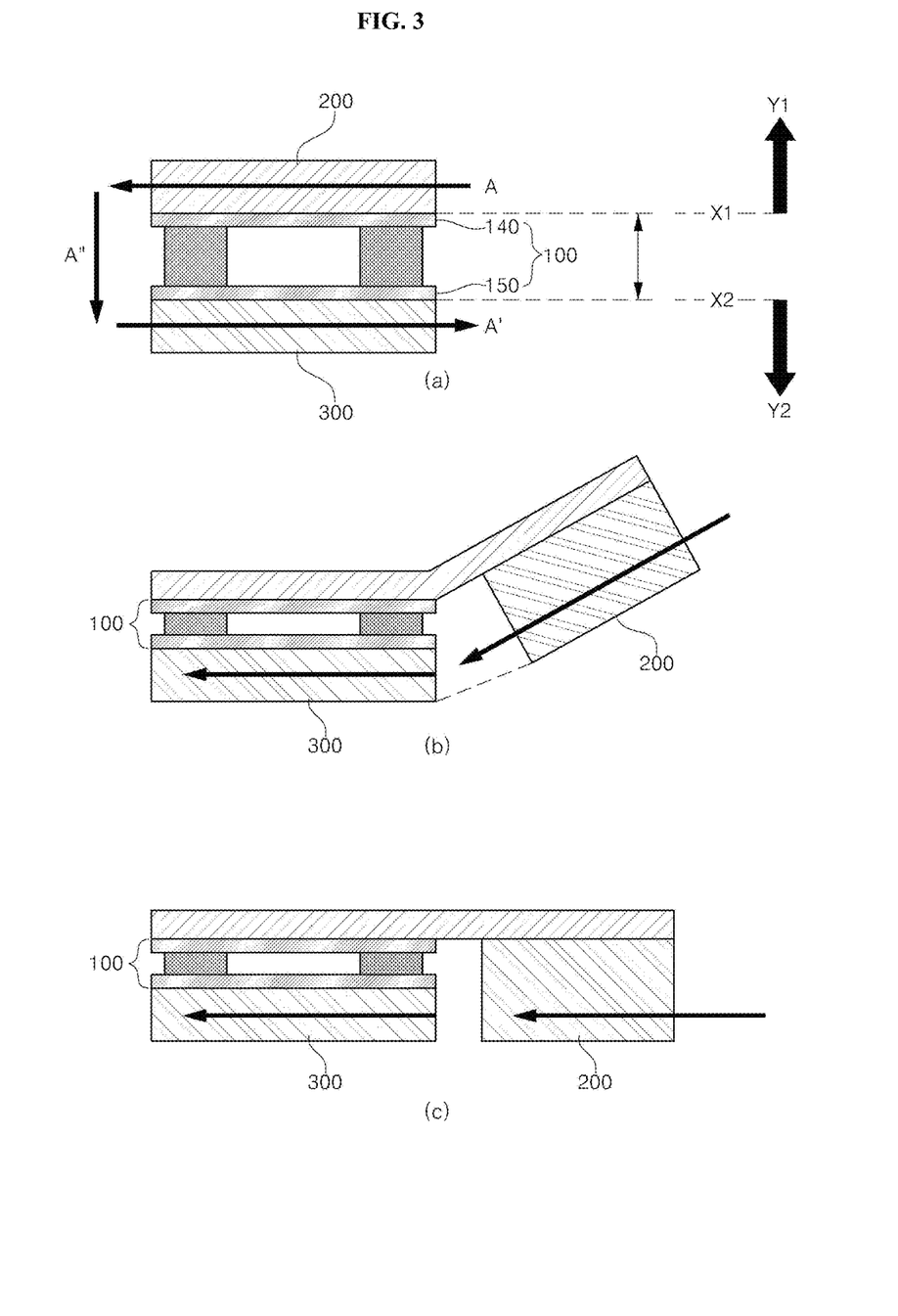
FIG. 3 is a conceptual view illustrated for explaining an arrangement structure of a first module and a second module according to the embodiment of the present invention of FIGS. 1 and 2.

FIG. 3 is a conceptual view illustrated for explaining an example of an arrangement structure of the first module 200 and the second module 300 according to the embodiment of the present invention of FIGS. 1 and 2.

As described above, the first module 200 and the third module 300 according to the present embodiment of the invention may be configured such that the first module and the second module are arranged in 'one side direction' based on the thermoelectric module 100. In such a case, the one side direction means any one direction f an upper direction Y1 and a lower direction Y2 based on the thermoelectric module 100. That is, when considering an upper plan extension line X1 of the first substrate 140 and a lower plan extension line X2, any one module of the first module and the second module is arranged in a direction in direct contact with the thermoelectric module, and the other module is arranged in a horizontal direction to the direction.

For example, as described in FIGS. 1 and 2, the second module 300 may be disposed at a lower portion of the thermoelectric module 100, and the second module 300 may be disposed so that the flow path of air can be formed in a horizontal direction of the second module 300. However, the arrangement structure of the first module and the second module is not limited to the arrangement structure in the horizontal direction. As illustrated in (B) of FIG. 3, even though the second module 200 is arranged to be regularly inclined based on the first substrate of the thermoelectric module 100, if a structure enables air to flow into the first module and the second module without the occurrence of flow path resistance resulting from the bending condition of a flow path of the air passing through the first module and the second module, the structure may be included in the arrangement structure in the one side direction of the present invention. That is, as a form of 'the arrangement structure in the one side direction' defined in the embodiment of the present invention, 'an arrangement in a horizontal direction' refers to all arrangement structures that enables external air to primarily pass through the first module, and thereafter, enables the air discharged by passing through the first module to enter into the second module and to pass through the second module. Accordingly, based on such an arrangement structure, an arrangement of the second module may be modified and performed in various forms.

That is, as shown in (A) of FIG. 3, like the arrangement structure of the first module 200 arranged at the upper portion of the thermoelectric module 100 and the second module 300 arranged at the lower portion of the thermoelectric module 100, rather than a bidirectional arrangement structure in which the first module and the second module are disposed to be closely attached to the upper portion and the lower portion based on the thermoelectric module, all modified examples having a structure in which the first module 200 except for the second module 300 in contact with the thermoelectric module comes into contact with the first substrate 140, and the second module 300 is disposed to extend in an external side direction rather than an upper direction are included in the embodiment of the present invention.

When the first module and the second module are disposed such that, in the structure of (A) of FIG. 3, entering air A is cooled while passing through the first module 200, moisture in the air is condensed, and the air after passing through the first module goes by way of an air flow path bent in "U"-like shape and enters into the second module 300 arranged in a lower direction of the thermoelectric module, thereby enabling drying of the air due to the heating function, flow path resistance is generated in the bent region, so a dehumidifying effect is reduced. Accordingly, in the embodiments of the present invention, the air flow path bent in the "U"-like shape is not formed, the first module and the second module are arranged in a horizontal direction of the air flow path so that flow path resistance can be minimized.

Figure 4:
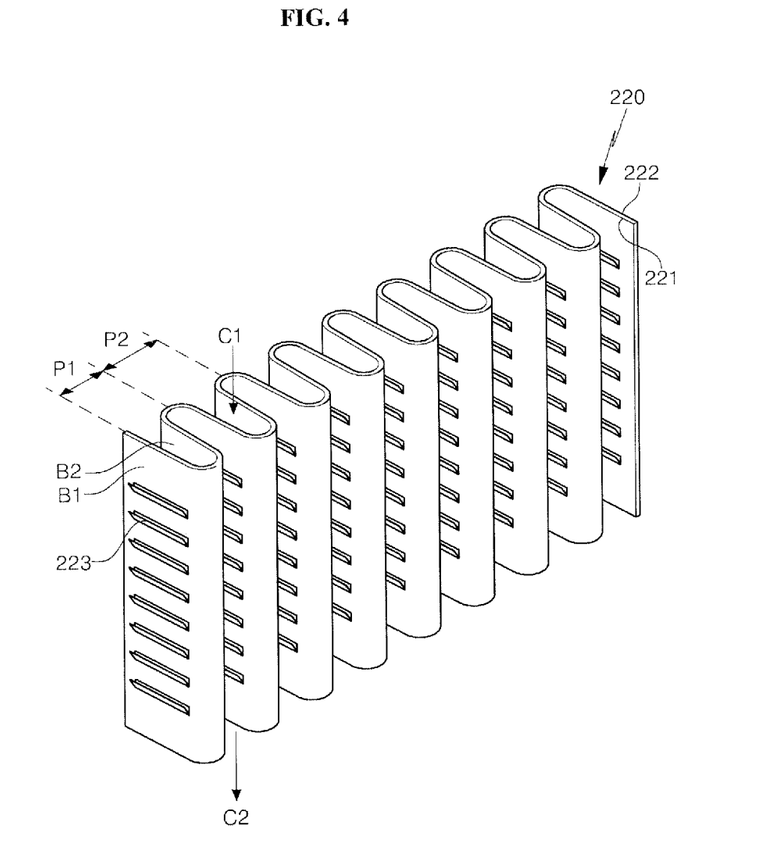
FIGS. 4 to 6 are conceptual views illustrated for explaining a structure of a first heat transfer member and a second heat transfer member of FIG. 1.
Figure 5:
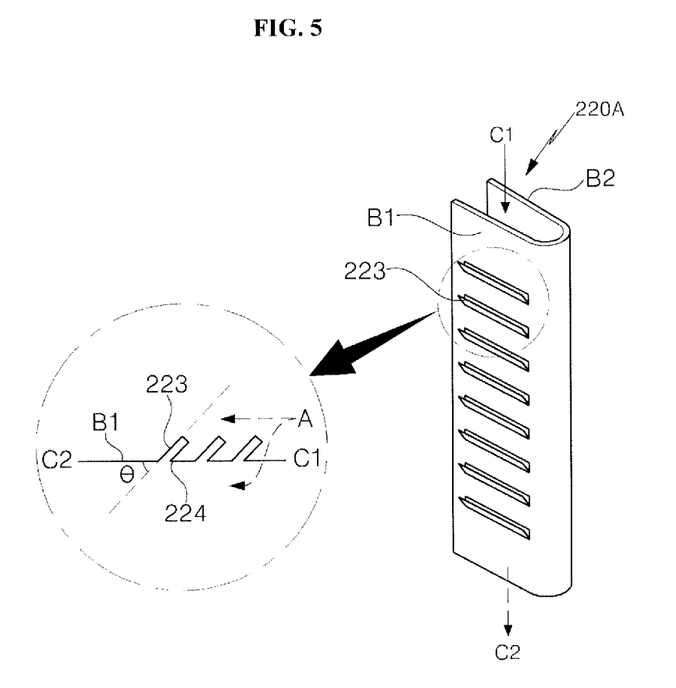
Figure 6:
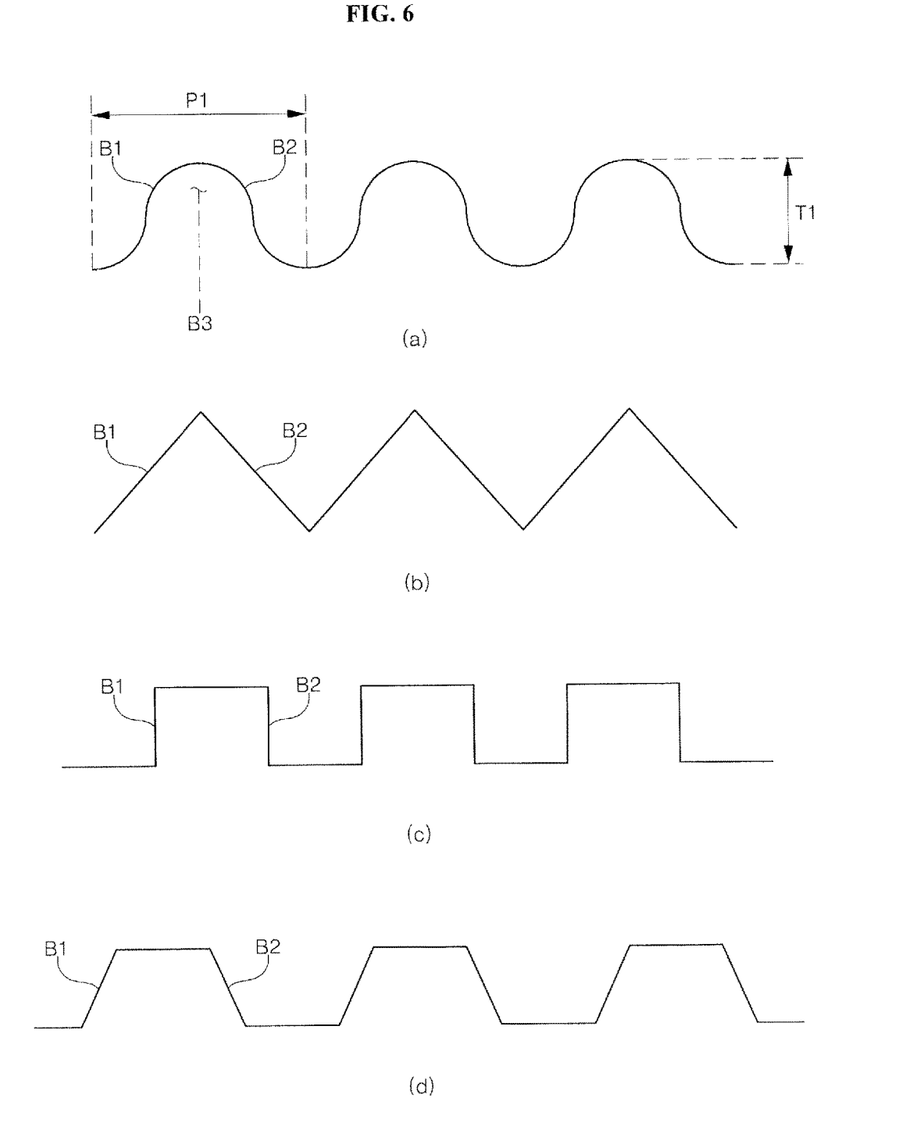

FIGS. 4 to 6 are conceptual views illustrated for explaining a structure of the first heat transfer member and the second heat transfer member of FIG. 1.

Referring to FIGS. 1, 4 and 5, the first heat transfer member 220 or the second heat transfer member 320 according to the embodiment of the present invention may be formed in a structure in which at least one flow path pattern 220A forming an air flow path C1 corresponding to a fixed movement route of air is implemented on the substrate in a flat plate-like shape of a first plane 221 and a second plane 222 opposite to the first plane, so that surface contact with air can be performed.

As illustrated in FIGS. 4 and 6, the flow path pattern 220A may be implemented in such a manner that the substrate is formed in a folding structure so that curvature patterns each having a regular pitch P1, P2 and height T1 can be formed. The flow path pattern may be formed in various modified forms as illustrated in FIG. 6 as well as the form illustrated in FIG. 4. That is, the first heat transfer member 220 or the second heat transfer member 320 according to the embodiment of the present invention may have two planes in contact with air, and may be implemented in the structure in which the flow path pattern is formed for maximizing a surface area in contact. In the structure illustrated in FIG. 4, when air enters from a flow path direction C1 of an air incoming part, the air may uniformly come into contact with the first plane 221 and the second plane 222 opposite to the first plane 221, and may travel in an end direction C2 of the flow path. Thus, contact with more air in the same space than contact with air generated from a contact surface in a simple flat plate-like shape may be introduced, so that a heating absorbing effect and a heating emitting effect can be improved.

In particular, in order to further improve a contact area with air, as illustrated in FIGS. 4 and 5, the first heat transfer member 220 or the second heat transfer member 320 according to the embodiment of the present invention may include protruding resistance patterns 223 on a surface of the substrate. In consideration of the unit flow path patterns, the resistance patterns 223 may be formed on a first curved surface B1 and a second curved surface B2. Furthermore, as shown in the partial enlarged view of FIG. 5, the resistance patterns 223 are formed in protruding structures inclined to have a regular inclination angle θ in a direction in which air enters so that friction with the air can be maximized, thereby enabling an increase in contact area or contact efficiency. Furthermore, grooves 224 are formed on the surface of the substrate at the front of the resistance patterns 223, and thus the air in contact with the resistance patterns 223 passes partially through a front surface and a rear surface of the substrate via the grooves (hereinafter referred to as 'the flow grooves (224)') so that the frequency or area of contact can be increased. Also, in an example illustrated in FIG. 5, the resistance patterns are disposed so that resistance in an air flow direction can be maximized, but the present invention is not limited to such a configuration. According to each resistance design, the protruding resistance patterns may be designed in an opposite direction to the direction of the protruding resistance patterns so that a level of resistance can be adjusted. In FIG. 5, the resistance patterns 223 are formed on an external surface of the heat transfer member, but such a structure of the resistance patterns may be also changed to a structure in which the resistance patterns are formed on an internal surface of the heat transfer member.

FIG. 6 is a conceptual view illustrating various embodiments of a flow path pattern of the first heat transfer member and the second heat transfer member.

As illustrated in (A) of FIG. 6, a pattern having a curvature resulting from a regular pitch P1 may be repeatedly formed, as illustrated in (B) of FIG. 6, unit patterns of the flow path pattern may be implemented in the repeated structure of a pattern structure having a triangular shape, or as illustrated in (C) and (D) of FIG. 6, the unit patterns may be variously implemented to have a cross section having a polygonal structure. Of course, the resistance patterns explained with regard to FIG. 5 may be provided on the surfaces B1, B2 of each flow path pattern.

The flow path patterns illustrated in FIG. 5 is formed in the structure having a regular pitch to have a regular cycle. However, unlike this structure, the pitches of the unit patterns may be non-uniformly implemented, and the cycles of the patterns may be also non-uniformly implemented. Furthermore, a height T1 of each unit pattern may be also non-uniformly changed.

With regard to the aforesaid structure of the first heat transfer member and the second heat transfer member, when considering the heat conversion device as the embodiment of the present invention illustrated in FIGS. 1 and 2, the pitches of the flow path patterns of the first heat transfer member and the second heat transfer member included in the first module 200 and the second module 300 may be differently adjusted. In particular, the pitch of each flow path pattern of the first heat conversion member may be formed larger than that of each flow path pattern of the second heat conversion member.

Specifically, a ratio (P1:P2) of the pitch P1 of the flow path pattern of the first heat transfer member 220 included in the first module 200 to the pitch P2 of the flow path pattern of the second heat transfer member 320 included in the second module 300 may be formed in the range of 1~1.4:1. Thanks to the structure of the heat transfer member in FIGS. 4 and 5 according to the embodiment of the present invention that forms the flow path patterns, a much larger contact area in the same volume than that generated from a heat transfer member having a flat plate type structure or an existing heat radiation structure may be implemented. The contact area of air may be increased by 50% or more compared to the heat transfer member having the flat plate type structure, and accordingly, a size of the module may be largely reduced. However, like the structure of FIGS. 1 and 2, in consideration of the condensing efficiency of primarily entered humid air and heating and drying efficiency of the air from which moisture is removed, the ratio of the pitch of the curvature pattern of the first heat transfer member 210 included in the first module 200 to the pitch of the curvature pattern of the second heat transfer member 310 included in the second module 300 may be formed in the range of 1~1.4:1.

Also, a volume of the first module 200 may be formed less than a volume of the second module 300. In particular, in such a case, in consideration of a total plane area formed by the first module and the second module, a plane area occupied by the heat absorption module corresponding to the first module 200 may range from 5 to 50%. When the plane area of the heat absorption module is less than 5%, a condensing process for air may not be property performed, and thus condensing efficiency may be reduced. When the plane area of the heat absorption module is more than 50%, condensed air may not be partially discharged due to delay in condensation.

More preferably, a ratio of the plan area (d1*e1) of the first module illustrated in FIG. 2 to the plan area (d2*e2) of the second module may be formed in a range of 1:1~10. Also, the first module 200 and the second module 300 may be separated from each other to have a maximum separation distance d2. In order to enable efficiency transfer of the condensed air by preventing re-condensation, and increase heating and drying efficiency, the maximum separation distance d2 may be formed in the range of 0.01 to 50.0 mm. When the maximum separation distance d2 is less than 0.01 mm, temperature offset may be generated from a part adjacent to the heat absorption part and the heat emission part of the first module and the second module, so cooling efficiency may be reduced. When the maximum separation distance d2 is more than 50.0 mm, most of the condensed air may be dispersed, so transfer of the air to the second module may not be efficiently performed.

Figure 7:
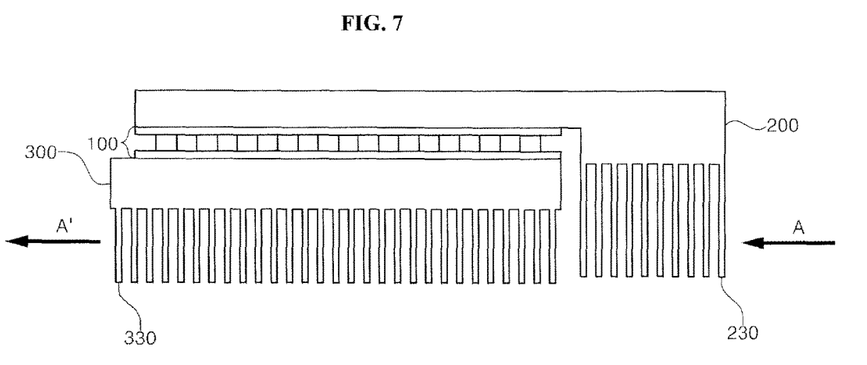
FIG. 7 illustrates a structure of a heat conversion device according to another embodiment of the present invention.

FIG. 7 illustrates a structure of a heat conversion device according to another embodiment of the present invention.

As described above, in the present embodiment of the invention, a structure having a folding structure (a structure in which flow path patterns are formed), which performs surface contact with air via a heat transfer member, is applied. In such a case, the first module 200 (heat absorption module) and the second module 300 (heat emission module) are disposed so that air can be transmitted in a horizontal direction to air flow, thereby enabling the minimization of flow path resistance.

In the embodiment of FIG. 7, various structures in a pin type rather than the heart transfer member having the structure as shown in FIG. 4 may be applied as a heat absorption member 230 and a heat emission member 330. In this case, the first module (heat absorption module) and the second module (heat emission module) are also disposed so that air can be transmitted in a horizontal direction to air flow. Thus the heat conversion device capable of minimizing flow path resistance is illustrated in FIG. 7. Of course, a volume of the heat absorption member 230 and the heat emission member 330, which can be disposed in the same area, is reduced compared to that of the heat transfer member of FIG. 4, and a size of the heat absorption member 230 and the heat emission member 330, which can be disposed in the same space, is also limited, so heat conversion efficiency may be slightly reduced. However, as described above, it is advantageous in that the first module (heat absorption module) and the second module (heat emission module) are also disposed so that air can be transmitted in a horizontal direction to air flow, thereby enabling the minimization of flow path resistance.

Figure 8:
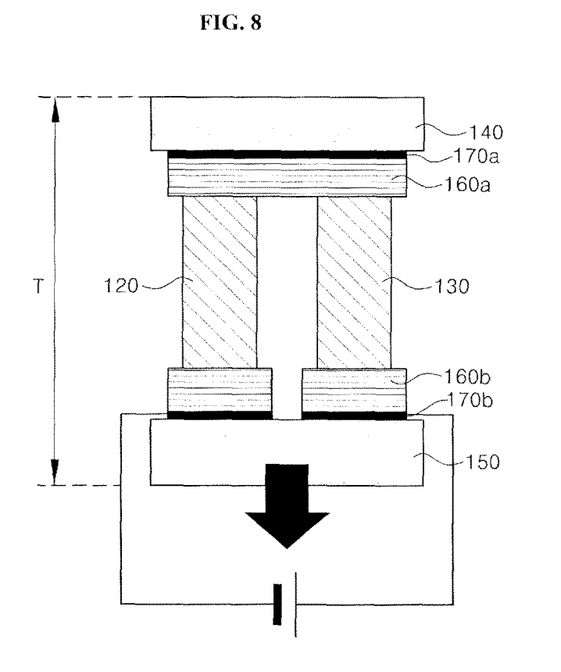
FIG. 8 illustrates the structure of a unit cell of a thermoelectric module including a thermoelectric element in contact with the first module and the second module according the embodiment of the present invention.
Figure 9:
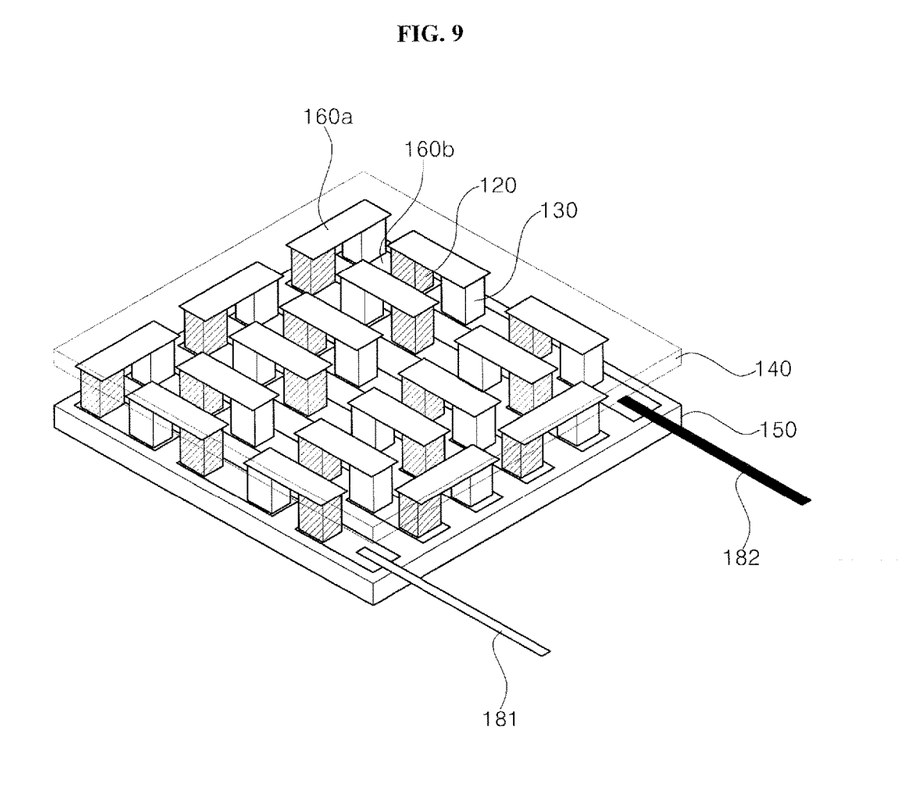
FIG. 9 illustrates an example of a thermoelectric module in which the plurality of structures of FIG. 8 is arranged.

FIG. 8 illustrates the structure of a unit cell of the thermoelectric module including the thermoelectric element in contact with the first module and the second module according the embodiment of the present invention and FIG. 9 illustrates an example of the thermoelectric module in which the plurality of structures of FIG. 8 is arranged.

As illustrated in FIGS. 8 and 9, the thermoelectric module including the thermoelectric element according to the present embodiment of the invention may include at least one unit cell including the first substrate 140 and the second substrate 150 facing each other, and a first semiconductor element 120 and a second semiconductor element 130 electrically connected to each other between the first substrate 140 and the second substrate 150. An insulating substrate, for example, an alumina substrate, may be used as the first substrate 140 and the second substrate 150, or according to another embodiment, a metal substrate may be used so that heat absorbing efficiency and heat emitting efficiency can be increased, and a slimming structure can be implemented. Of course, when the first substrate 140 and the second substrate 150 are formed with metal substrates, as illustrated in FIG. 8, dielectric layers 170a, 170b may be further formed on electrode layers 160a, 160b formed on the first substrate 140 and the second substrate 150. In the aforesaid structure with regard to FIG. 1, when the third substrate 201A and the fourth substrate 301A of the first module 200 and the second module 300 are integrally formed with the first substrate and the second substrate, a material, such as alumina, Cu, a Cu alloy and so on, may be applied to the substrates.

In the case of the metal substrate, Cu or a Cu alloy may be applied, and a thickness of the metal substrate may range from 0.1 to 0.5 mm for enabling a slimming structure. When the thickness of the metal substrate is thinner than 0.1 mm or is thicker than 0.5 mm, a radiant heat property may be excessively increased, or reliability of the thermoelectric module may be largely reduced due to too high heat conductivity. Also, in the case of the dielectric layers 170a, 170b, in consideration of heat conductivity of the cooling thermoelectric module of a dielectric material having high radiant heat performance, a material having a heat conductivity of 5~10 W/K may be used, and a thickness of the dielectric layer may range from 0.01 to 0.15 mm. In such a case, when the thickness is less than 0.01 mm, insulating efficiency (or a withstand voltage property) may be largely reduced. When the thickness is more than 0.15 mm, heat conductivity may be reduced, and thus radiant heat efficiency may be reduced. The electrode layers 160a, 160b connect the first semiconductor element and the second semiconductor element using an electrode material such as Cu, Ag, Ni, and the like. When the plurality of illustrated unit cells are connected to each other, as illustrated in FIG. 9, the electrical connection of adjacent unit cells is formed. A thickness of the electrode layer may range from 0.01 to 0.3 mm. When the thickness of the electrode layer is less than 0.01 mm, a function of the electrode layer as an electrode may be reduced, and thus the electrode layer may have poor electric conductivity. When the thickness is more than 0.3 mm, conductive efficiency may be reduced due to an increase in resistance.

In particular, in this case, a thermoelectric element including unit elements having a layered structure according to the present embodiment of the invention may be applied as the thermoelectric element constituting the unit cells. One side of the thermoelectric element may be composed of a p-type semiconductor as the first semiconductor element 120 and an N-type semiconductor as the second semiconductor element 130, and the first semiconductor and the second semiconductor may be connected to the metal electrodes 160a, 160b. Thus, such a structure is formed in plural numbers, and the Peltier effect is implemented by circuit lines 181, 182 for supplying electric currents to the semiconductor elements via the electrode.

Moreover, a P-type semiconductor material or an N-type semiconductor material may be applied to the semiconductor elements in the thermoelectric module in FIGS. 8 and 9. With regard to the P-type semiconductor material or the N-type semiconductor material, the N-type semiconductor element may be formed using a mixture in which a main raw material composed of a BiTe-based material including Se, Ni, Al, Cu, Ag, Pb, B, Ga, Te, Bi, and In is mixed with 0.001 to 1.0 wt % of Bi or Te based on a total weight of the main raw material. For example, when the main raw material is a Bi—Se—Te material, 0.001 to 1.0 wt % of Bi or Te based on the total weight of the Bi—Se—Te material may be further added to the Bi—Se—Te material. That is, when the Bi—Se—Te material is injected in an amount of 100 g, Bi or Te, which is additionally mixed with the Bi—Se—Te material, may be added in the amount of 0.001 to 1.0 g. As described above, the weight range of the material added to the main raw material has significance in light of the fact that when the weight range of the material added to the main raw material deviates from the range of 0.001 to 0.1 wt %, heat conductivity is not reduced, but electric conductivity is reduced, so the improvement of a ZT value cannot be expected.

The P-type semiconductor element may be formed using a mixture in which a main raw material composed of a BiTe-based material including Se, Ni, Al, Cu, Ag, Pb, B, Ga, Te, Bi, and In is mixed with 0.001 to 1.0 wt % of Bi or Te based on a total weight of the main raw material. For example, when the main raw material is a Bi—Se—Te material, 0.001 to 1.0 wt % of Bi or Te based on the total weight of the Bi—Se—Te material may be further added to the Bi—Se—Te material. That is, when the Bi—Se—Te material is injected in an amount of 100 g, Bi or Te, which is additionally mixed with the Bi—Se—Te material, may be added in the amount of 0.001 to 1.0 g. As described above, the weight range of the material added to the main raw material has significance in light of the fact that when the weight range of the material added to the main raw material deviates from the range of 0.001 to 0.1 wt %, heat conductivity is not reduced, but electric conductivity is reduced, so the improvement of a ZT value cannot be expected.

The first semiconductor element and the second semiconductor element facing each other while forming the unit cells may have the same shape and size. However, in such a case, an electric conductivity property of the P-type semiconductor element and an electric conductivity property of the N-type semiconductor element are different from each other, and this serves as a factor that reduces cooling efficiency. Thus, in consideration of this fact, any one semiconductor element of the semiconductor elements may be formed to have a different volume from that of the other semiconductor element so that cooling performance can be improved.

That is, the forming the semiconductor elements of unit cells disposed to face each other so as to have different volumes may be implemented in such a manner that entire shapes of the semiconductor elements are differently formed, a cross section of any one of the semiconductor elements having the same height is formed to have a wide diameter, or the semiconductor elements having the same shape are formed to have different heights or different diameters in each cross section. In particular, the N-type semiconductor element is formed to have a larger volume than that of the P-type semiconductor element so that thermoelectric efficiency can be improved.

As set forth above, according to some embodiments of the present invention, in the structure of the heat exchange device to which the thermoelectric module is applied, the heat absorption module and the heat emission module are disposed in the horizontal direction so that a heat conversion effect to air with maintaining a desired air volume and air velocity without resistance of an air flow path can be implemented, and thus the heat conversion function of high efficiency can be performed in spite of low power consumption.

Also, according to some embodiments of the present invention, the heat conversion members in surface contact with air are disposed on the heat absorption module and the heat emission module, and the heat conversion member having a structure in which a plurality of flow paths is formed in a folding structure is applied so that a contact area with air can be maximized, thereby enabling the high improvement of heat conversion efficiency.

Furthermore, according to some embodiments of the present invention, friction with air on a curvature surface of the unit heat conversion part of the heat conversion member can be increased, and heat conversion efficiency can be improved by forming resistance patterns capable of improving air circulation and patterns having a structure in which flow grooves are connected.

Also, in spite of a limited area of the heat exchange device due to the heat conversion members having the folding structure, the heat conversion device having high efficiency can be formed, and a general-purpose design arrangement can be implemented by thinly forming a volume of the product itself.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A heat conversion device, comprising:
   a first module including a first heat conversion member;
   a second module including a second heat conversion member that introduces air passing through the first module to perform heat conversion; and
   a thermoelectric module that comes into contact with the first module and the second module to control a heat conversion function,
   wherein the first module and the second module are arranged in one side direction based on the thermoelectric module,
   wherein the one side direction is defined as any one direction of an upper direction and a lower direction of the thermoelectric module, wherein at least one of the first heat conversion member and the second heat conversion member includes: a substrate having a first plane in surface contact with air and a second plane opposite the first plane; and at least one flow path pattern that forms an air flow path in the substrate in an air flow direction, wherein the first module and the second module arranged in the one side direction are arranged in a horizontal direction to a longitudinal direction formed by a first substrate and a second substrate of the thermoelectric module, and wherein the thermoelectric module has a thermoelectric semiconductor that is electrically connected between the first substrate and the second substrate.

2. The heat conversion device of claim 1, wherein the first module includes a first heat conversion member receiving unit including a third substrate extending to come into contact with the first substrate of the thermoelectric module.

3. The heat conversion device of claim 2, wherein the third substrate is integrally formed with the first substrate.

4. The heat conversion device of claim 1, wherein the second module includes a second heat conversion member receiving unit including a fourth substrate in contact with the second substrate of the thermoelectric module.

5. The heat conversion device of claim 4, wherein an air discharging surface of the first module and an air inlet surface of the second module are separated from each other.

6. The heat conversion device of claim 5, wherein a separation distance between the air discharging surface and the air inlet surface ranges from 0.01 to 50.0 mm.

7. The heat conversion device of claim 4, wherein a volume of the first module has the same as that of the second module.

8. The heat conversion device of claim 4, wherein a volume of the first module is smaller than that of the second module.

9. The heat conversion device of claim 4, wherein a ratio of a volume of the first module to a volume of the second module is 1:1~10.

10. The heat conversion device of claim 1, further comprising resistance patterns formed on a surface of the flow path pattern to protrude from a surface of the substrate.

11. The heat conversion device of claim 10, further comprising flow grooves connected to each end of the resistance patterns.

12. The heat conversion device of claim 1, wherein the flow path pattern has a structure in which a curvature pattern having a regular pitch is implemented in a longitudinal direction of the substrate.

13. The heat conversion device of claim 12, wherein a ratio of a pitch of a curvature pattern formed at the heat conversion member of the first module to a pitch of a curvature pattern formed at the heat conversion member of the second module is 1~1.4:1.

14. The heat conversion device of claim 12, wherein the first module and the second module are configured such that at least two first heat conversion members and at least two second heat conversion members are laminated.

15. The heat conversion device of claim 1, wherein at least any one of the first heat conversion member and the second heat conversion member includes a plurality of radiant heat pins formed on a radiant heat substrate to protrude in the one side direction.

16. The heat conversion device of claim 15, wherein the thermoelectric module includes a unit thermoelectric element in which a thermoelectric semiconductor element is disposed between substrates facing each other.

17. The heat conversion device of claim 16, wherein the first module is a cooling module connected to a heat absorption part of the thermoelectric module, and the second module is a heating module connected to a heat emission part of the thermoelectric module.

* * * * *